(12) United States Patent
Volkovich et al.

(10) Patent No.: US 10,025,285 B2
(45) Date of Patent: Jul. 17, 2018

(54) ON-PRODUCT DERIVATION AND ADJUSTMENT OF EXPOSURE PARAMETERS IN A DIRECTED SELF-ASSEMBLY PROCESS

(71) Applicant: KLA-TENCOR CORPORATION, Milpitas, CA (US)

(72) Inventors: Roie Volkovich, Hadera (IL); Eran Amit, Haifa (IL); Nuriel Amir, St. Yokne'am (IL); Michael E. Adel, Zichron Ya'akov (IL)

(73) Assignee: KLA-Tencor Corporation, Milpitas, CA (US)

( * ) Notice: Subject to any disclaimer, the term of this patent is extended or adjusted under 35 U.S.C. 154(b) by 287 days.

(21) Appl. No.: 14/755,758

(22) Filed: Jun. 30, 2015

(65) Prior Publication Data

US 2015/0301514 A1    Oct. 22, 2015

Related U.S. Application Data (63) Continuation of application No. PCT/US2014/042366, filed on Jun. 13, 2014.

(60) Provisional application No. 61/834,757, filed on Jun. 13, 2013.

(51) Int. Cl.
| | |
|---|---|
| *G06F 17/50* | (2006.01) |
| *G05B 19/048* | (2006.01) |
| *G03F 7/00* | (2006.01) |
| *H01L 21/66* | (2006.01) |
| *G03F 7/20* | (2006.01) |

(52) U.S. Cl.
CPC ......... *G05B 19/048* (2013.01); *G03F 7/0002* (2013.01); *G03F 7/70625* (2013.01); *H01L 22/12* (2013.01); *H01L 22/20* (2013.01); *G05B 2219/33285* (2013.01)

(58) Field of Classification Search
USPC .......................... 716/50, 51, 52, 53, 54, 55
See application file for complete search history.

(56) References Cited

U.S. PATENT DOCUMENTS

| | | | | |
|---|---|---|---|---|
| 6,704,661 | B1 * | 3/2004 | Opsal | G01B 11/24 356/625 |
| 2005/0044513 | A1 * | 2/2005 | Robles | G03F 1/36 716/53 |
| 2006/0288325 | A1 * | 12/2006 | Miyamoto | G03F 7/70625 716/50 |
| 2007/0054201 | A1 * | 3/2007 | Hung | G03F 1/34 430/5 |
| 2008/0134130 | A1 * | 6/2008 | Baum | G03F 1/36 716/53 |
| 2008/0168419 | A1 * | 7/2008 | Burkhardt | G03F 1/36 716/53 |
| 2010/0096640 | A1 | 4/2010 | Kim et al. | |

(Continued)

*Primary Examiner* — Brian Ngo
(74) *Attorney, Agent, or Firm* — Suiter Swantz pc llo (57) ABSTRACT

Methods and metrology tool modules embodying the methods are provided. Methods comprise measuring characteristics of intermediate features such as guiding lines in a directed self-assembly (DSA) process, deriving exposure parameters from the measured characteristics; and adjusting production parameters for producing consecutive target features according to the derived exposure parameters. The methods and modules enhance the accuracy of the DSA-produced structures and related measurements.

16 Claims, 4 Drawing Sheets

(56) References Cited

U.S. PATENT DOCUMENTS

| | | |
|---|---|---|
| 2011/0147984 A1 | 6/2011 | Cheng et al. |
| 2011/0209106 A1* | 8/2011 | Cheng .................. G03F 1/38 716/55 |
| 2012/0054694 A1* | 3/2012 | Hamouda ............ G03F 7/705 716/53 |
| 2012/0133017 A1 | 5/2012 | Millward et al. |
| 2012/0221982 A1* | 8/2012 | Jeong .................. G03F 1/36 716/53 |
| 2012/0276346 A1 | 11/2012 | Russell et al. |
| 2013/0099362 A1 | 4/2013 | Kim et al. |

\* cited by examiner

ON-PRODUCT DERIVATION AND ADJUSTMENT OF EXPOSURE PARAMETERS IN A DIRECTED SELF-ASSEMBLY PROCESS

CROSS REFERENCE TO RELATED APPLICATIONS

This application is filed under 35 U.S.C. § 120 and § 365(c) as a continuation of International Patent Application Serial No. PCT/US14/42366, filed on Jun. 13, 2014, which application claims the benefit under 35 U.S.C. 119(e) of U.S. Provisional Patent Application No. 61/834,757, filed on Jun. 13, 2013, which applications are incorporated herein by reference in their entirety.

FIELD OF THE INVENTION

The present invention relates to the field of metrology, and more particularly, to target produced by a directed self-assembly (DSA) process.

BACKGROUND OF THE INVENTION

Metrology targets are designed to enable the measurement of parameters that indicate the quality of wafer production steps and quantify the correspondence between design and implementation of structures on the wafer. Metrology targets as specific structures optimize the requirements for device similarity and for optical measurability.

Monitoring the exposure parameters such as the effective dose and focus enhance metrology target related techniques and allow better process and product monitoring. As target features depend on exposure parameters, measuring the exposure parameters enhances the metrology results for target structures.

BRIEF SUMMARY OF THE INVENTION

One aspect of the present invention provides a method comprising measuring characteristics of intermediate features in a directed self-assembly (DSA) process, deriving exposure parameters from the measured characteristics and adjusting production parameters for producing consecutive target features according to the derived exposure parameters.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Prior to the detailed description being set forth, it may be helpful to set forth definitions of certain terms that will be used hereinafter.

The term "exposure parameters" as used in this application refers to any photolithography-based production scanner parameter or other parameters relating to exposure steps, with respect to an of the production steps such as lithography, etching etc. as explained below and including any respective parameter thereof. Non-limiting examples for exposure parameters comprise scanner parameters such as focus and dose as well as exposure-related parameters such as etch time, etch bias, plasma density etc.

The term "geometric characteristics" as used in this application refers to results of metrology target measurements and respective target quantifying parameters. Non-limiting examples for geometric characteristics comprise critical dimensions (CD) of features, side wall angles (SWA), feature heights and so forth. The term "geometric characteristics" as used in this application refers to any measurements that may be achieved by a range of metrology technologies, e.g., scatterometry, imaging, CDSEM (critical dimension scanning electron microscope) etc.

The term "guiding line" as used herein in this application, is defined as a designed line in any type of layer, which serves to direct polymerization in a DSA process. It is noted that the term "guiding line" refers to any type of guiding structure, under implementation of any type of DSA process (e.g., graphoepitaxy, chemoepitaxy). Specifically, guiding lines may be target elements themselves and/or serve to produce polymer patterns which are used as target structures or as a basis for producing target structures by further processing.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Figure 1:
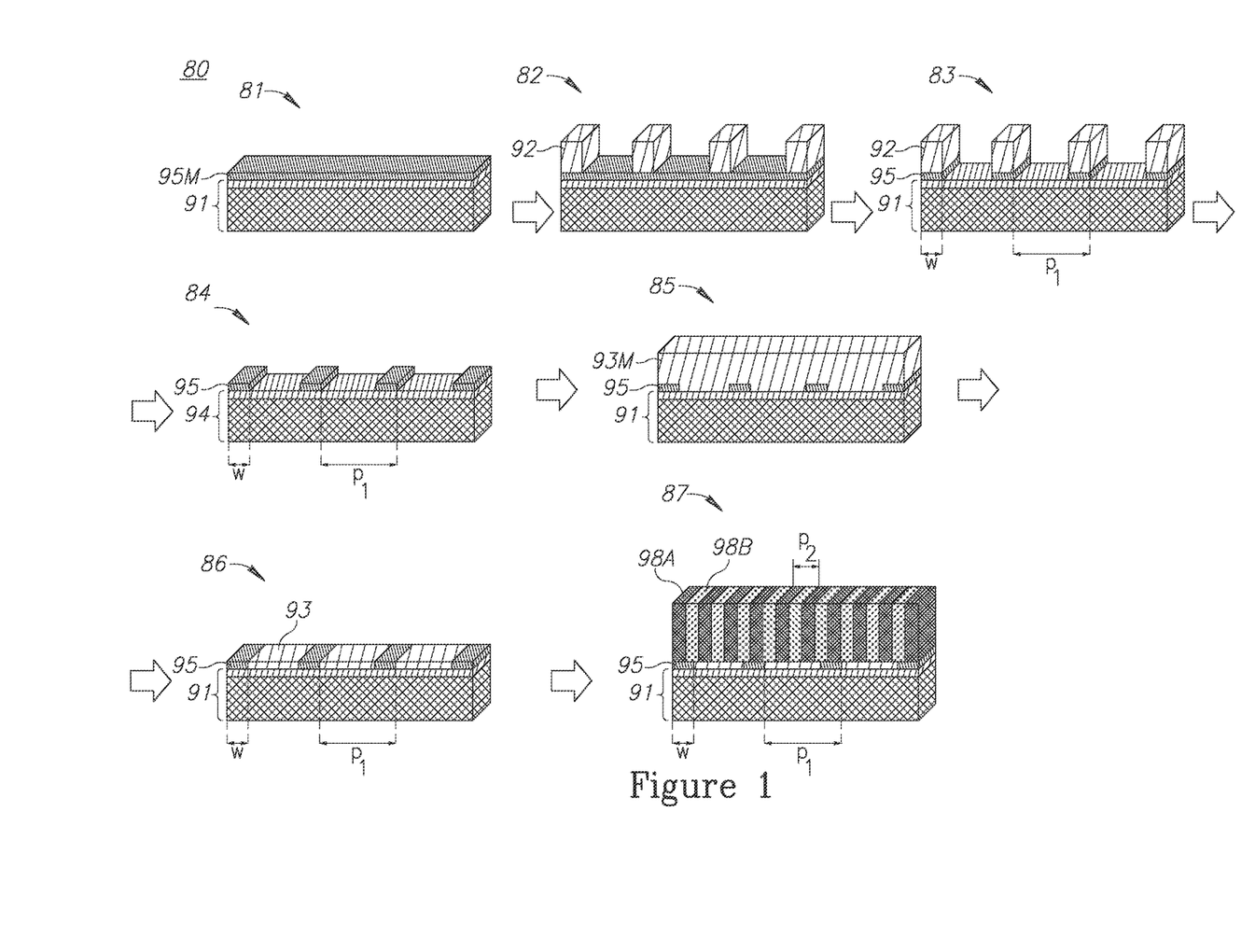
FIG. 1 is a high level schematic block diagram illustrating the production of structures using the directed self-assembly (DSA) process.

Disclosed methods and metrology tool modules embodying the methods comprise measuring characteristics of intermediate features such as guiding lines in a directed self-assembly (DSA) process, deriving exposure parameters from the measured characteristics; and adjusting production parameters for producing consecutive target features according to the derived exposure parameters. The methods and modules enhance the accuracy of the DSA-produced structures and related measurements. Advantageously, disclosed methods and modules enable control over process parameters by adjusting various exposure parameters such as scanner focus and dose, as well as exposure-related parameters such as etch time, etch bias, plasma density etc. in-line on production wafers. FIG. 1 is a high level schematic block diagram illustrating the production of structures using the directed self-assembly (DSA) process. The DSA process is used to create structures by directing a block co-polymerization process according to intermediate features such as guiding lines which determine the spatial arrangement of the polymer blocks. The structures may be part of device structure or of metrology targets. The production accuracy of the intermediate features strongly effects the eventual polymerization that creates the final structure features, and is hence a central determinant of the overall production accuracy.

FIG. 1 schematically illustrates steps 80-86 of producing guide line 95 and the DSA (polymerization) step 87. In first step 81, guideline material 95M is attached to a substrate 91 (which may itself be composite and/or multilayered). For example, in a DSA process involving polystyrene (PS) and polymethylmethacrylate (PMMA) molecules, guideline material may be PS which is cross linked onto substrate 91. It is noted that while examples in the current disclosure relate to a PS-PMMA DSA process, these materials are not limiting the scope of the invention, the principles of which may be applied to other polymers and DSA systems as well. Step 82 is a lithographic step defining which guideline material 95M will be removed using mask 92, step 83 is an etching step in which guideline (and mask) material is removed to reach the designed guide line dimensions (e.g., by dry plasma etch) and step 84 is a resist removal step (rinse) that results in the prepared guidelines. Process 80 is configured to produce guidelines 95 at a specified width w and periodicity characterized by pitch $p_1$, which may vary throughout the produced structure (e.g., a metrology target). In the DSA process, guidelines 95 are designed to direct the polymerization of the DSA polymers to form a specified pattern. After step 84, the intermediate features (e.g., guiding lines 95) may be measured to assure correct production and/or to estimate production inaccuracies. Moreover, exposure parameters may be corrected to improve target accuracy.

Next, step 85 grafts material 93M onto substrate 91 to fill the spaces between guiding lines 95, e.g., using OH-Brush grafting, and guiding lines 95 are re-exposed in step 86 to present guiding lines 95 interspaced by grafts 93 which support the DSA polymerization process. At step 86, the guiding line pattern is ready for the actual application of the DSA process, resulting, at block co-polymerization (BCP) annealing step 87, in fine and parallel polymer lines 98A, 98B formed by polymerization (possibly involving an annealing step) which is directed by guiding lines 95 (in the PS-PMMA DSA example, polymer lines 98A, 98B are PS and PMMA, respectively). The resulting structure is characterized by pitch(es) $p_2$ which is smaller than pitch(es) $p_1$ of guiding lines 95. Typically, guiding lines 95 after plasma etch process step 83 have a line-space ratio (defined as a ratio of line width to space width, $w/(p_1-w)$, also termed duty cycle). In the DSA process, the line-space ratio is smaller than 1, usually smaller than ⅓, and determined according to the dimensions and characteristics of molecules that participate in BCP stage 87. The duty cycle makes the geometrical grating of guiding lines 95 very sensitive to focus, especially the side wall angle (SWA) of the grating, and can be used as a focus dose sensitive target for monitoring and controlling the focus and dose of the scanner or stepper or related exposure parameters such as etch time, etch bias, plasma density etc. The grating formed by guiding lines 95 and characterized by the line-space ratio may be used as a target to determine exposure parameters such as focus and dose, possibly during actual production.

In certain embodiments, characteristics of intermediate features such as guiding lines 95 may be measured and used to derive exposure parameters which may then be used to adjust production parameters for producing consecutive target features such as polymer lines 98A, 98B, according to the derived exposure parameters. In certain embodiments, derived exposure parameters may be used to correct or adjust target measurements involving polymer lines 98A, 98B and/or guiding lines 95.

The measured characteristics may be geometric such as critical dimension (CD) and/or side wall angle (SWA) and/or feature heights of the intermediate features (e.g., guiding lines 95) and/or be imaging characteristics such as contrast differences between target structures or changes in pupil plane images. Geometric characteristics may comprise measurements using any metrology technology; non-limiting examples include scatterometry, imaging and CDSEM (critical dimension scanning electron microscope).

The derivation of exposure parameters may be carried out directly, e.g., using principle component analysis (PCA) and/or indirectly, using geometric measurement signals associated with the measured characteristics. In certain embodiments, the derivation of exposure parameters may be carried out by library based approaches (e.g., based on Rigorous Coupled-Wave Analysis (RCWA) as a non-limiting example) or library free approaches such as PCA, applicable e.g., when using measurements of imaging characteristics such as contrast differences or pupil image changes. Any of these methods may be used to calculate the corresponding exposure parameters such as focus and dose values and to yield focus/dose corrections for controlling the production process.

Figure 2:
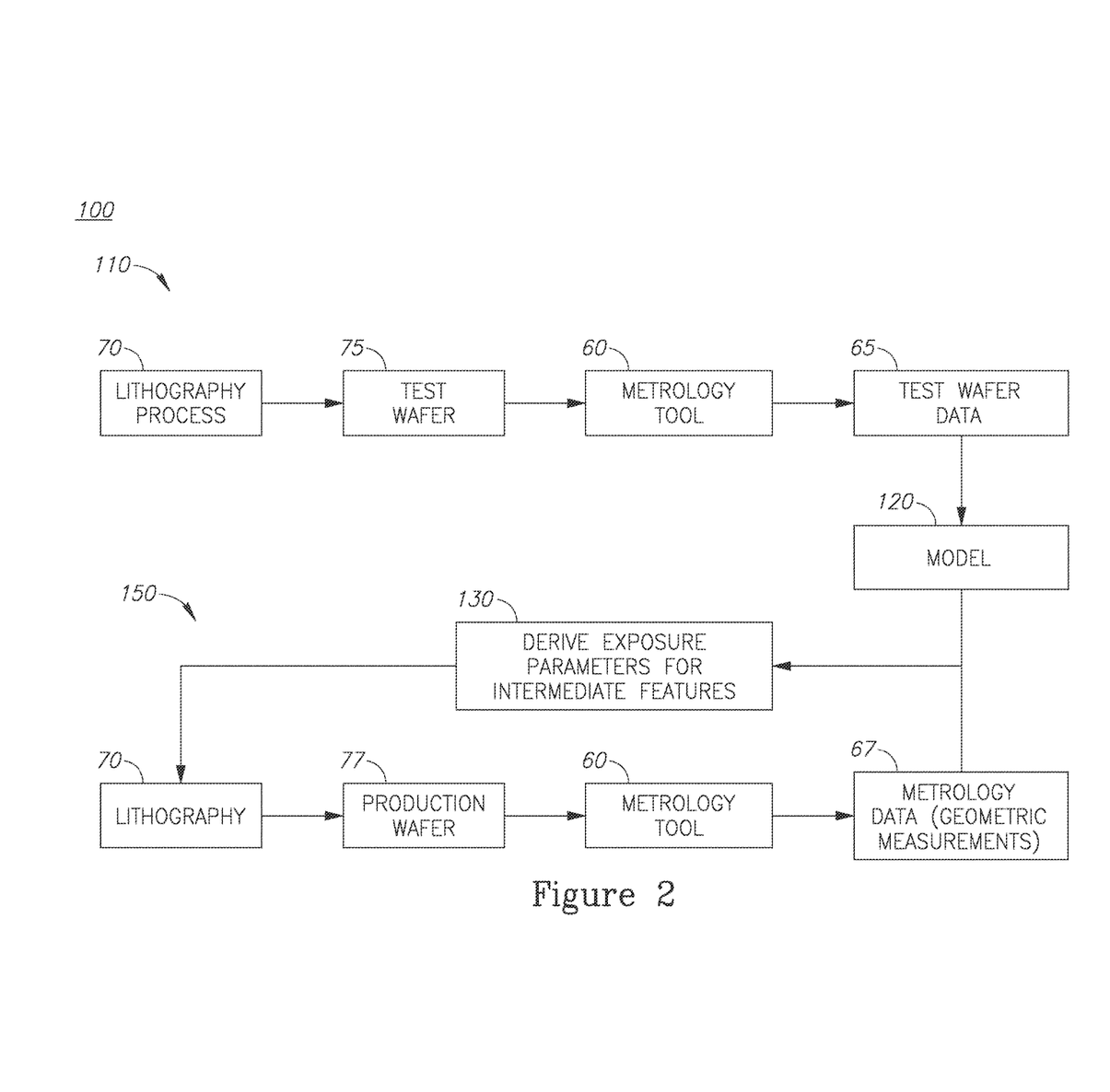
FIG. 2 is a high level schematic illustration of a process flow using focus/dose corrections, according to some embodiments of the invention; and, FIG. 3 is a high level schematic flowchart of a method, according to some embodiments of the invention.

FIG. 2 is a high level schematic illustration of a process flow using focus/dose corrections 100, according to some embodiments of the invention. Elements of process flow 100 may be embedded or integrated into a respective metrology tool 60. In particular, module 130 and/or modeling unit 120 may be integrated into metrology tool 60 and/or may be at least partially implemented in hardware.

Metrology tool 60 may comprise at least one module 130 configured to measure characteristics of intermediate features (e.g., DSA guiding lines) in a DSA process; derive exposure parameters from the measured characteristics; and adjust production parameters for producing consecutive target features according to the derived exposure parameters. Process flow 100 comprises, in production stage 150, measurements of targets produced by photolithography 70 on a production wafer 77, by metrology tool 60 to yield metrology data 67 such as geometric characteristics (e.g., CD, SWA) or imaging characteristics (e.g., contrast differences, changes in the pupil images etc.). At least a part of metrology data 67 may be used to derive exposure parameters and be processed by module 130, e.g., to derive exposure parameters such as focus and dose correctables and adjust exposure parameters to produce consecutive target features at higher accuracy or to correct for identified inaccuracies. Module 130 may be configured to carry out the derivation using PCA or geometric measurement signals associated with the measured characteristics.

In a non-limiting example, the target production may be carried out via a directed self-assembly (DSA) process (as part of lithography process 70), and module(s) 130 may be configured to derive the exposure parameters with respect to intermediate features of the target such as produced target DSA guiding lines (on production wafer 77) and use the derived exposure parameters to improve the accuracy of any of the target production, the target measurements and the device production.

The creation of guiding lines 95 in lithography step 82, etching step 83 and rinse step 84 is critical to the DSA lithography because it determines critical dimension (CD) uniformity, line robustness, and geometry consistency which control BCP annealing 87, applying exposure parameters measurement after one or more of any of steps 82 (lithography), 83 (etching) and 84 (rinsing) may provide crucial input regarding target production and measurement. For example, monitoring focus and dose as representative but non-limiting exposure parameters, may allow achieving CD uniformity, reducing defects, and improving DSA yield.

Module 130 may use a model 120, possibly derived in a training stage 110 by producing a test wafer 75 using lithography process 70 similar to the production process and by applying metrology tool 60 to test wafer 75 to derive test wafer data 65 used to derive the model by respective modeling unit 120. The model may then be used by module 130 to support exposure parameter derivation and any of the adjustments.

The inventors have found out, that such a model may be constructed by using multiple FEM wafers 75 having varying programmed focus offsets. Under experimental settings, a linear relation has been established between the best focus and the programmed focus, or in general a specified functional dependency $Focus_{best}=f(Focus_{programmed})$ may be used as model 120 for calibrating model-less focus measurement.

It is noted however, that model 120 may also be derived during actual production stage 150 by modeling unit 120 (e.g., from exposure parameters derived during former measurements of targets on production wafer 77) and used on the fly to adjust exposure parameters and/or target measurements by module 130.

In certain embodiments, metrology measurements may be performed at lithography step 82 and fed forward, via module 130, under-layer information to after plasma etch step 83, which may be used to improve overlay CD (OCD) model accuracy (as model 120 in certain embodiments) for guiding lines 95 by reducing the geometrical parameters correlation. The difference between DOI (Dimensions Of Interest) values that may be calculated from the metrology measurements before and after plasma etch 83 may be used to calculate the etch effect on guiding lines 95. The measurements may also be used to construct or enhance focus exposure model (FEM) 120. In certain embodiments, lithography step 82 may include an etch step, module 130 may be applied to this etch step, and FEM model 120 may include etch parameters.

In certain embodiments, derivation of exposure parameters (including e.g., focus dose measurements) may be embedded after lithography step 82 as well as after rinsing step 84 for controlling guiding lines 95. In addition, derivation of exposure parameters (e.g., the focus dose measurements) may be used to planning DoE (Design of Experiment) by carrying out the derivation during lithography step 82 and plasma etch step 83 to improve rinsing step 84. In a non-limiting example, several FEM wafers 75 with different etching parameters (as exposure parameters) may be created after etch step 83 to enable better adjustment of exposure parameters in rinsing step 84.

Using test (FEM) wafers 75 in prior art applications requires time and involve the challenge of creating appropriate models of the wafer with respect to systematically varying etch parameters, such as flux density from center to edge. Metrology measurements of FEM test wafer 75, relating to dimension of interest such as MCD, SWA (side wall angle), SWA asymmetry, grating thickness, under layer thickness, etc. may also be liable to inaccuracies with respect to actual measurements of production wafer 77. In particular, finding the correct targets for focus and dose applications requires a significant amount of time and several measurement iterations until the targets should be sensitive to focus and dose variations and printable. Additionally, the targets on test wafer 75 are usually not similar to the device dimensions (that could be memory or logic) a fact which further affects the calculation accuracy. The disclosed invention overcomes most or all of these limitations.

Advantageously, the inventors have found out that incorporating focus and dose monitoring and control of guiding line manufacturing in the DSA process, and using guiding lines 95 as grating targets enable, for the first time, the possibility for on-product focus and dose application module 130 in the DSA process, which is not attainable by current technology. Furthermore, these measurements may be carried out after lithography, etch, rinse etc. and thereby to include various parameters, including etch parameters, as exposure parameters to enable feedback to both the scanner and the etcher. Finally, the disclosed invention provides much more accurate FEM models 120 as well as OCD models 120, faster focus and dose measurements as producing test wafers 75 for this purposes becomes in certain embodiments redundant, and make the production of guiding lines 95, as a critical stage of the DSA process, more uniform and robust, to make BCP annealing more accurate and the DSA process more efficient.

Figure 3:
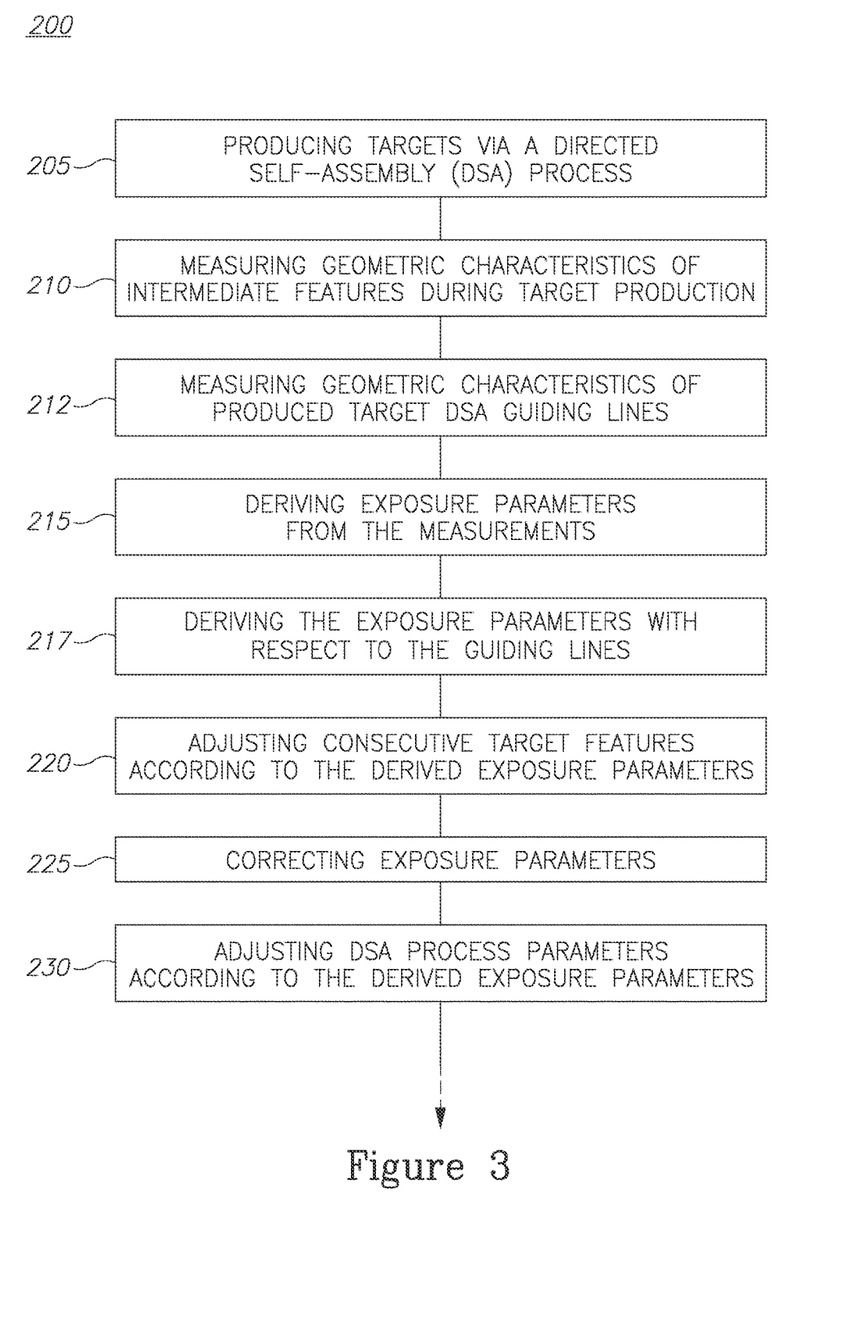

FIG. 3 is a high level schematic flowchart of a method 200, according to some embodiments of the invention. Method 200 may comprise any of the following stages. Certain embodiments comprise computer program products comprising a computer readable storage medium having computer readable program embodied therewith. The computer readable program may be configured to carry out, at least partially, any of the stages of method 200.

Method 200 comprises measuring geometric or imaging characteristics of intermediate features during target production (stage 210), deriving exposure parameters from the measurements (stage 215) and correcting exposure parameters accordingly (stage 225) and/or adjusting consecutive target features according to the derived exposure parameters (stage 220). For example, method 200 may comprise carrying out the measuring of geometric characteristics and receptive derivation of the exposure parameters after a lithography stage and/or after an etching stage and (stage 250). The exposure parameters may comprise lithography parameters and/or etch parameters. For example, the exposure parameters may comprise focus and dose.

In certain embodiments, method 200 further comprises producing targets via a directed self-assembly (DSA) process (stage 205), measuring the geometric characteristics with respect to produced target DSA guiding lines or other intermediate structures (stage 212), deriving the exposure parameters with respect to the intermediate features (stage 217) and using the derived exposure parameters to adjust measurements of DSA targets (stage 235). Method 200 may further comprise adjusting DSA process parameters according to the derived exposure parameters (stage 230).

Method 200 may further comprise using a model of the exposure parameters to adjust any of the target features, the production process and/or the measurements (stage 240) and optionally deriving the model in a training stage (stage 245).

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
   measuring, with a metrology tool, one or more characteristics of one or more intermediate features formed on a production wafer via at least one of a lithography, etching, or rinsing step in a directed self-assembly process;
   deriving, with a processor, one or more exposure parameters from the measured characteristics of the one or more intermediate features; and
   providing at least one of one or more correction-of-exposure parameters or one or more adjustment-of-production parameters to a fabrication tool for fabricating one or more additional features according to the one or more exposure parameters.

2. The method of claim 1, wherein the intermediate features are directed self-assembly guiding lines.

3. The method of claim 1, wherein the characteristics are geometric characteristics.

4. The method of claim 3, wherein the geometric characteristics comprise at least one of a critical dimension and a side wall angle.

5. The method of claim 1, wherein the characteristics are imaging characteristics.

6. The method of claim 5, wherein the imaging characteristics comprise at least one of contrast differences and pupil image changes.

7. The method of claim 1, wherein the step of deriving exposure parameters from the measured characteristics of the intermediate features is carried out using principle component analysis.

8. The method of claim 1, wherein the step of deriving exposure parameters from the measured characteristics of the intermediate features is carried out using geometric measurement signals associated with the measured characteristics of intermediate features.

9. The method of claim 1, further comprising:
   implementing a model of the exposure parameters to carry out at least one of the step of deriving exposure parameters from the measured characteristics of the intermediate features, the step of providing at least one of a correction of exposure parameters, or the step of providing at least one of an adjustment of production parameters for producing consecutive target features according to the exposure parameters.

10. The method of claim 9, further comprising deriving the model in a training stage.

11. The method of claim 1, wherein the exposure parameters comprise at least one of lithography parameters and etch parameters.

12. The method of claim 1, wherein the exposure parameters comprise at least one of a focus and a dose.

13. A system comprising:
   a metrology tool configured to measure one or more characteristics of one or more intermediate features formed on a production wafer following at least one of a lithography, etching, or rinsing step on a wafer in a directed self-assembly process; and
   a computer configured to execute a computer readable program configured to derive one or more exposure parameters from the measured characteristics of the intermediate features, wherein the computer readable program is maintained in a computer readable storage medium,
   the computer further configured to execute the computer readable program configured to provide at least one of one or more correction of exposure parameters or one or more adjustment of production parameters to a fabrication tool for fabricating one or more additional features according to the one or more exposure parameters.

14. The system of claim 13, wherein the metrology tool is configured to measure characteristics of targets produced via the directed self-assembly process, the intermediate features comprise directed self-assembly guiding lines, and the characteristics are geometric characteristics comprising at least one of a critical dimension, a side wall angle, or imaging characteristics comprising contrast differences.

15. The system of claim 13, wherein the computer is further configured to:
   perform a derivation process using at least one of a principle component analysis or geometric measurement signals associated with the measured characteristics.

16. The system of claim 13, wherein the computer is further configured to:

derive a model of the exposure parameters during a training stage and carry out at least one of the deriving and the adjusting steps using the model.

* * * * *